(12) United States Patent
U'Ren

(10) Patent No.: US 7,795,703 B1
(45) Date of Patent: *Sep. 14, 2010

(54) SELECTIVE AND NON-SELECTIVE EPITAXY FOR BASE INTERGRATION IN A BICMOS PROCESS

(75) Inventor: Greg D. U'Ren, Corona del Mar, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/290,987

(22) Filed: Nov. 5, 2008

Related U.S. Application Data

(63) Continuation of application No. 11/899,850, filed on Sep. 8, 2007, now Pat. No. 7,462,923, which is a continuation of application No. 11/146,537, filed on Jun. 6, 2005, now Pat. No. 7,291,898.

(51) Int. Cl.
*H01L 27/082* (2006.01)

(52) U.S. Cl. ............................... 257/565; 257/E21.379; 438/312

(58) Field of Classification Search .................. 257/565, 257/586, 592, 197, E21.379; 438/312, 341, 438/353, 363
See application file for complete search history.

(56) References Cited

U.S. PATENT DOCUMENTS

| 4,829,016 | A | 5/1989 | Neudeck |
| 5,834,800 | A | 11/1998 | Jalali-Farahani et al. |
| 5,861,640 | A | 1/1999 | Gomi |
| 7,291,898 | B1 | 11/2007 | U'Ren |
| 7,462,923 | B1 * | 12/2008 | U'Ren ........................ 257/565 |

OTHER PUBLICATIONS

The American Heritage Dictionary, Second College Edition (1982), p. 867.

* cited by examiner

*Primary Examiner*—Mark Prenty
(74) *Attorney, Agent, or Firm*—Farjami & Farjami LLP

(57) ABSTRACT

According to one exemplary embodiment, a bipolar transistor includes an active area situated between first and second isolation regions in a substrate. The bipolar transistor further includes an epitaxial extension layer situated on the active area, where the epitaxial extension layer extends over the first and second isolation regions. The bipolar transistor further includes a base layer situated on the epitaxial extension layer, where the base layer includes an epitaxial base, and where the epitaxial base includes a usable emitter formation area. The active area has a first width and the usable emitter formation area has a second width, where the second width is at least as large as the first width.

20 Claims, 5 Drawing Sheets

SELECTIVE AND NON-SELECTIVE EPITAXY FOR BASE INTERGRATION IN A BICMOS PROCESS

This is a continuation of application Ser. No. 11/899,850 filed on Sep. 8, 2007 and issued as U.S. Pat. No. 7,462,923 on Dec. 9, 2008, which in turn is a continuation of application Ser. No. 11/146,537 filed Jun. 6, 2005 and issued as U.S. Pat. No. 7,291,898 on Nov. 6, 2007.

BACKGROUND OF THE INVENTION

1. Field of the Invention

The present invention is generally in the field of semiconductors. More specifically, the invention is in the field of bipolar and CMOS device fabrication.

2. Related Art

In Bipolar Complementary-Metal-Oxide-Semiconductor ("BiCMOS") technology, active area scaling has been utilized to increase the performance of transistors, such as silicon-germanium ("SiGe") heterojunction bipolar transistors (HBT). However, active area scaling is limited in a conventional BiCMOS integration process as a result of facet formation that occurs during a non-selective epitaxial process that is used for base layer formation. See, e.g., "Lateral Scaling Challenges for SiGe NPN BiCMOS Process Integration." Materials Science in Semiconductor Processing, Vol. 8 (2005) pp. 313-317 by G. D. U'Ren.

In a conventional BiCMOS integration process, prior to formation of the base layer, a wet etch (e.g., an HF etch) is typically performed to remove a sacrificial oxide layer situated on isolation regions and on an active area between the isolation regions. However, the wet etch results in a recess of the isolation region such that a silicon surface is exposed. As a result, during the subsequent base layer formation, typically involving a non-selective epitaxial deposition, the exposed silicon surface can cause uncontrolled facet formation, which causes an undesirable reduction in the usable area that is available for emitter formation. See, e.g., "Influence of Misfit Strain on {311} Facet Development in Selective Epitaxial Growth of SiGe (100) Grown by Gas Source Molecular Beam Epitaxy." Thin Solid Films Vol. 365, No. 1, April 2000 pp. 147-150, by G. D. U'Ren, M. S., Goorsky, and K. L. Wang.

In the conventional BiCMOS integration process, active area scaling is sought to minimize the distance between the extrinsic base regions and the collector region of the transistor in the formation of a vertical NPN transistor. A decrease in this distance favorably results in a decrease of the extrinsic base-collector capacitance. Extrinsic base-collector capacitance is one component of the sum total base-collector capacitance, which is inversely related to power gain of the bipolar transistor. Thus, in the conventional BiCMOS integration process, the performance route is well known, namely active scaling, but there exists a physical limitation in the implementation of active scaling due to facet formation at the isolation periphery. Consequently, this route to reaching greater performance of power gain is limited by such an obstacle. Moreover, the thin extrinsic base regions in the conventional bipolar transistor further contribute to the undesirable decrease in power gain in that the thin extrinsic base regions result in a higher base resistance. Thus, it is desirable to reduce the base resistance of the conventional bipolar transistor by, for example, increasing the thickness of the extrinsic base regions.

Thus, there is a need in the art for an improved method of forming a bipolar transistor in a BiCMOS process that provides increased active area scalability as well as promoting minimum extrinsic base resistance.

SUMMARY OF THE INVENTION

The present invention is directed to selective and non-selective epitaxy for base integration in a BiCMOS process and related structure. The present invention overcomes the need in the art for a bipolar transistor in a BiCMOS process that provides increased active area scalability and reduced base-collector capacitance and base resistance.

According to one exemplary embodiment, the invention's bipolar transistor includes an active area situated between first and second isolation regions in a substrate. For example, the bipolar transistor may be an NPN silicon-germanium heterojunction bipolar transistor. The bipolar transistor further includes an epitaxial extension layer situated on the active area, where the epitaxial extension layer extends over the first and second isolation regions. The epitaxial extension layer may be single-crystal silicon, for example. The bipolar transistor further includes a base layer situated on the epitaxial extension layer, where the base layer includes an epitaxial base, and where the epitaxial base includes a usable emitter formation area. The epitaxial base may be single-crystal silicon-germanium, for example.

According to this exemplary embodiment, the active area has a first width and the usable emitter formation area has a second width, where the second width is at least as large as the first width. The epitaxial extension layer causes the second width of the usable emitter formation area to be at least as large as the first width of the active area.

According to this exemplary embodiment, the bipolar transistor further includes a collector region situated under the epitaxial extension layer, where the epitaxial extension layer causes a reduction in capacitance between the collector region and the extrinsic base regions. Due to the increased thickness of the extrinsic base regions, the base resistance is also reduced. In another embodiment, the present invention is a method that achieves the above-described bipolar transistor. Other features and advantages of the present invention will become more readily apparent to those of ordinary skill in the art after reviewing the following detailed description and accompanying drawings.

DETAILED DESCRIPTION OF THE INVENTION

The present invention is directed to selective and non-selective epitaxy for base integration in a BiCMOS process and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
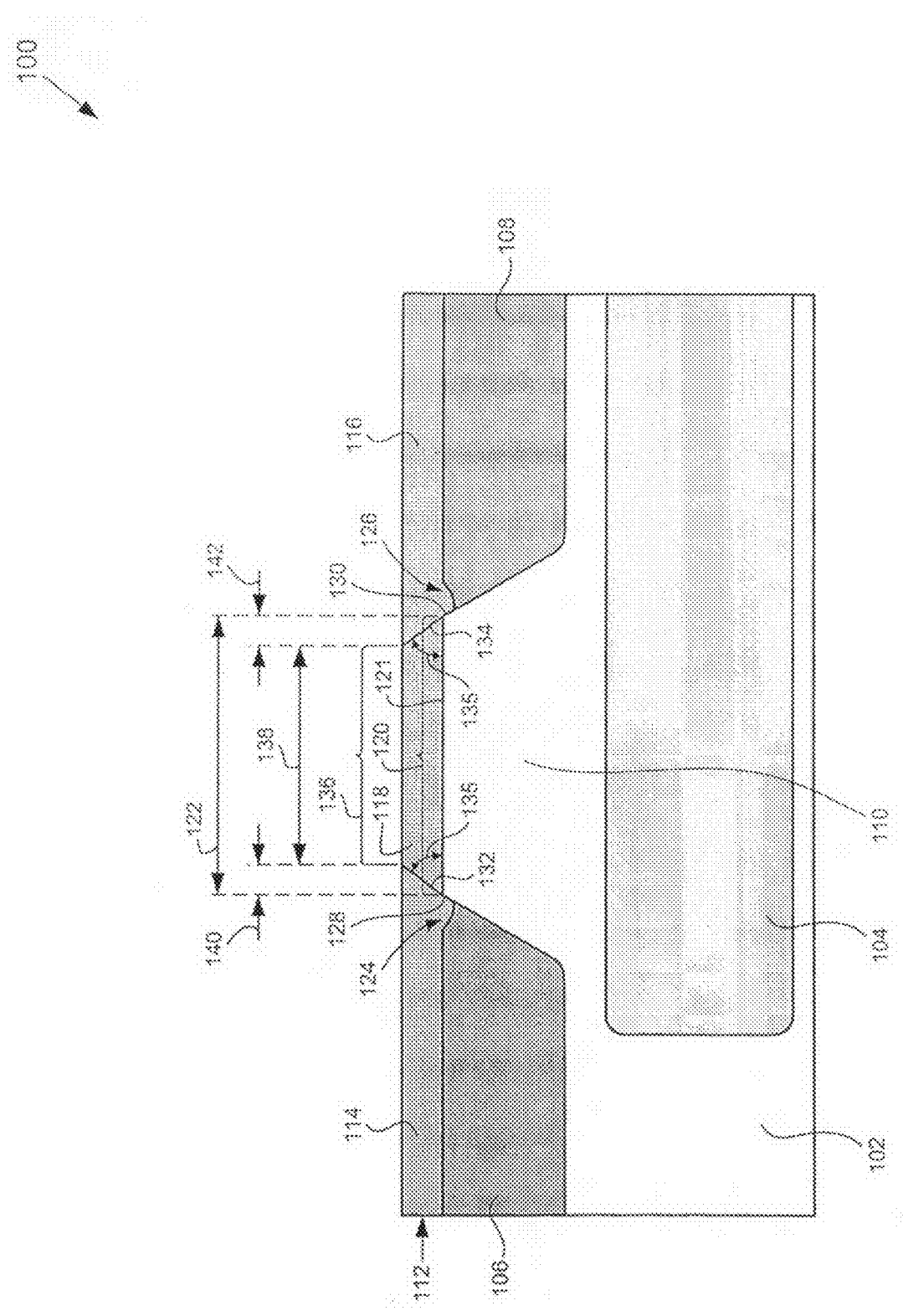
FIG. 1 illustrates a cross-sectional view of an exemplary structure including an exemplary conventional base layer.

FIG. 1 shows a cross-sectional view of an exemplary structure including an exemplary conventional base layer formed in a conventional BiCMOS process. Structure 100 includes substrate 102, buried layer 104, isolation regions 106 and 108, collector region 110, and conventional base layer 112, which includes polycrystalline base layer segments 114 and 116 and epitaxial base 118. Structure 100 shows a conventional NPN transistor, such as a conventional NPN SiGe HBT, in an intermediate stage of fabrication in a conventional BiCMOS process.

As shown in FIG. 1, buried layer 104 is situated in substrate 102, which is a silicon substrate. Buried layer 104 can comprise an N+ type region (i.e. relatively heavily doped N type region). Also shown in FIG. 1, collector region 110 is situated in substrate 102 over buried layer 104 and can comprise an N type region, which can be formed by implanting an appropriate N type dopant in substrate 102 between isolation regions 106 and 108. Further shown in FIG. 1, isolation regions 106 and 108 are situated in substrate 102 and can be shallow trench isolation ("STI") regions, which can comprise deposited silicon oxide. Also shown in FIG. 1, isolation regions 106 and 108 include recesses 124 and 126, which expose respective silicon surfaces 128 and 130.

Further shown in FIG. 1, conventional base layer 112 is situated over isolation regions 106 and 108 and active area 120 of substrate 102. Conventional base layer 112 includes polycrystalline base layer segment 114, which is situated over isolation region 106, polycrystalline base layer segment 116, which is situated over isolation region 108, and epitaxial base 118, which is situated over active area 120. Polycrystalline base layer segments 114 and 116 can comprise polycrystalline SiGe and epitaxial base 118 can comprise epitaxial (i.e. single-crystal) SiGe. In the conventional BiCMOS process, conventional base layer 112 is formed by using a non-selective epitaxial SiGe deposition process. In the non-selective epitaxial SiGe deposition process, epitaxial SiGe is formed on exposed silicon surfaces, such as active area 120, and polycrystalline SiGe is formed on oxide areas, such as isolation regions 106 and 108.

In the conventional BiCMOS process, prior to formation of conventional base layer 112, a thermal oxide layer (not shown in FIG. 1), which is situated on active area 120 and isolation regions 106 and 108, is typically removed by a wet etch process, which causes recesses 124 and 126 to be formed in the corners of respective isolation regions 106 and 108. Recesses 124 and 126 are formed as a result of a difference in etch rate between thermal oxide in the thermal oxide layer (not shown in FIG. 1) and deposited oxide in isolation regions 106 and 108 and cause respective silicon surfaces 128 and 130 to be exposed. During the non-selective epitaxial deposition process, interfaces 132 and 134 form in conventional base layer 112 at angle 135 with respective to silicon surface 121. However, as a result of respective silicon surfaces 128 and 130, which are exposed during the non-selective epitaxial deposition process, crystallographic facets form at interfaces 132 and 134 and cause angle 135 between interfaces 132 and 134 and silicon surface 121 to be unpredictable, but significantly less than 90.0 degrees.

As a result of interfaces 132 and 134, which are situated at angle 135 with respect to silicon surface 121, width 138 of usable emitter formation area 136 (i.e. the area of epitaxial base 118 that is usable for emitter formation) is significantly less than width 122 of active area 120. As shown in FIG. 1, width 138 of usable emitter formation area 136 plus distances 140 and 142 is substantially equal to width 122 of active area 120. By way of example, distances 140 and 142 can be approximately 0.1 micron ("u"). Thus, for example, if width 122 of active area 120 were scaled down to a width of 0.25 u in an advanced BiCMOS process, width 138 of usable emitter formation area 136 would be only 0.05 u (i.e. 0.25 u−(2·0.1 u)=0.05 u), which is an insufficient area for emitter formation. Thus, interfaces 132 and 134, which form at angle 135 as a result of crystallographic facets that form during formation of conventional base layer 112, undesirably limit the scalability of active area 120 in a resulting conventional bipolar transistor that includes base layer 112.

Figure 2:
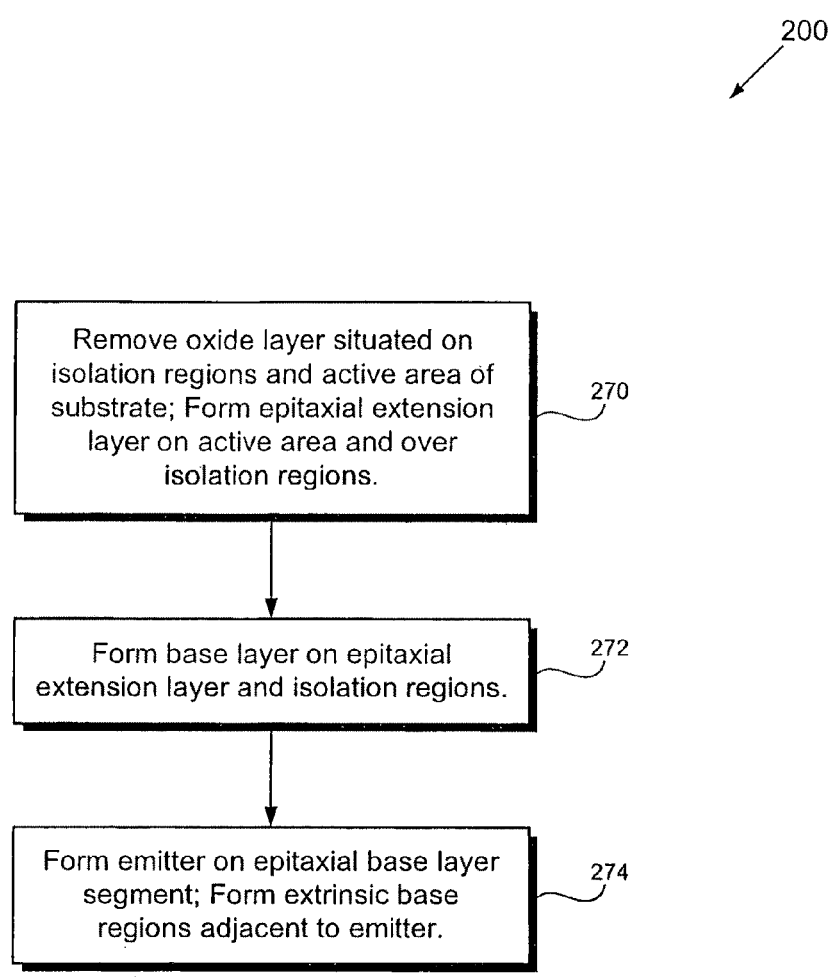
FIG. 2 shows a flowchart illustrating the steps taken to implement an embodiment of the present invention.

FIG. 2 shows a flowchart illustrating an exemplary method according to an embodiment of the present invention. Certain details and features have been left out of flowchart 200 that are apparent to a person of ordinary skill in the art. For example, a step may consist of one or more substeps or may involve specialized equipment or materials, as known in the art. Steps 270 through 274 indicated in flowchart 200 are sufficient to describe one embodiment of the present invention; however, other embodiments of the invention may utilize steps different from those shown in flowchart 200. It is noted that the processing steps shown in flowchart 200 are performed on a wafer which, prior to step 270 of flowchart 200, includes, among other things, isolation regions, such as shallow trench isolation regions, a buried layer, and a collector region formed in a substrate.

Figure 3A:
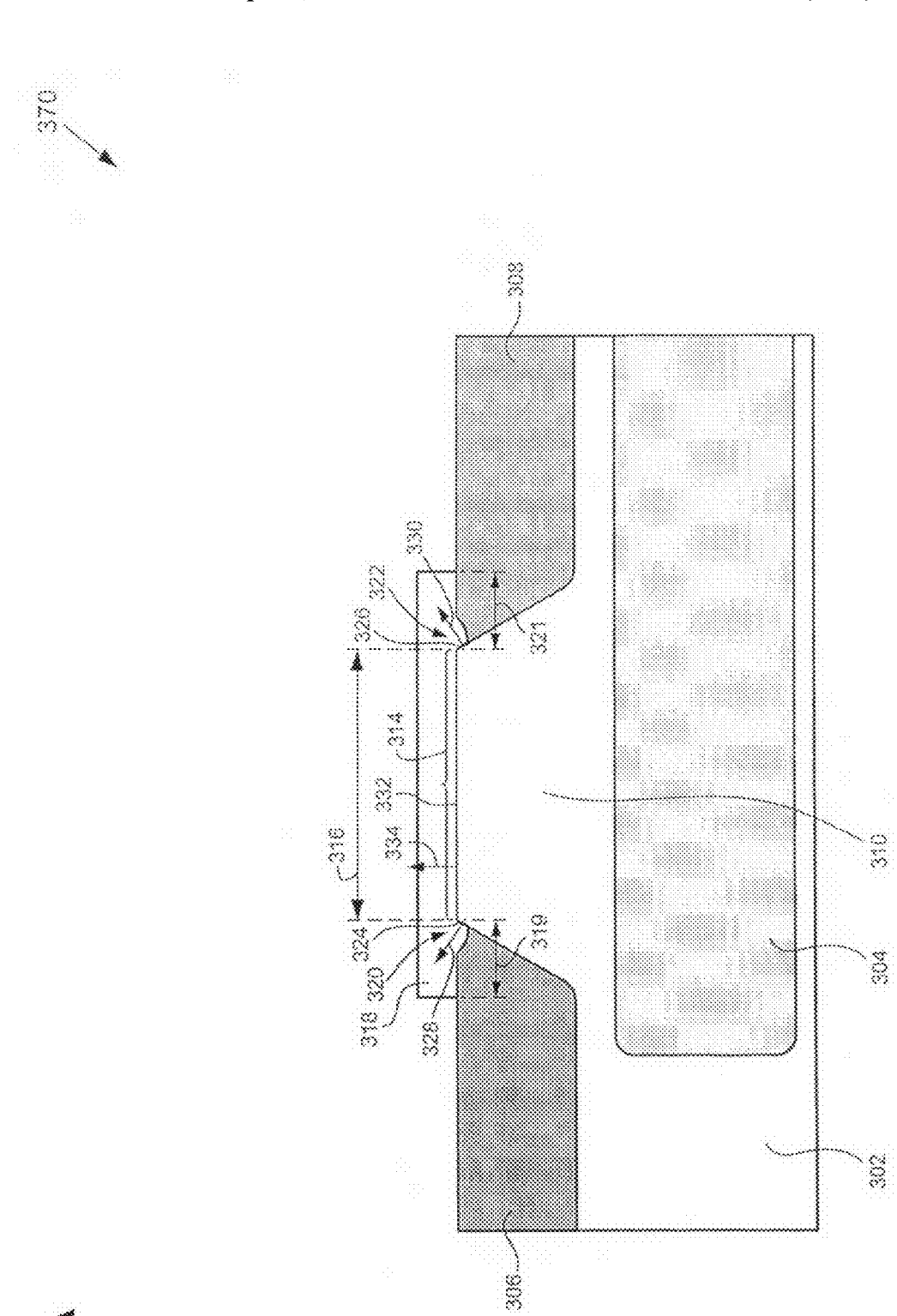
FIG. 3A illustrates a cross-sectional view, which includes a portion of a wafer processed according to an embodiment of the invention, corresponding to an initial step in the flowchart in FIG. 1.
Figure 3B:
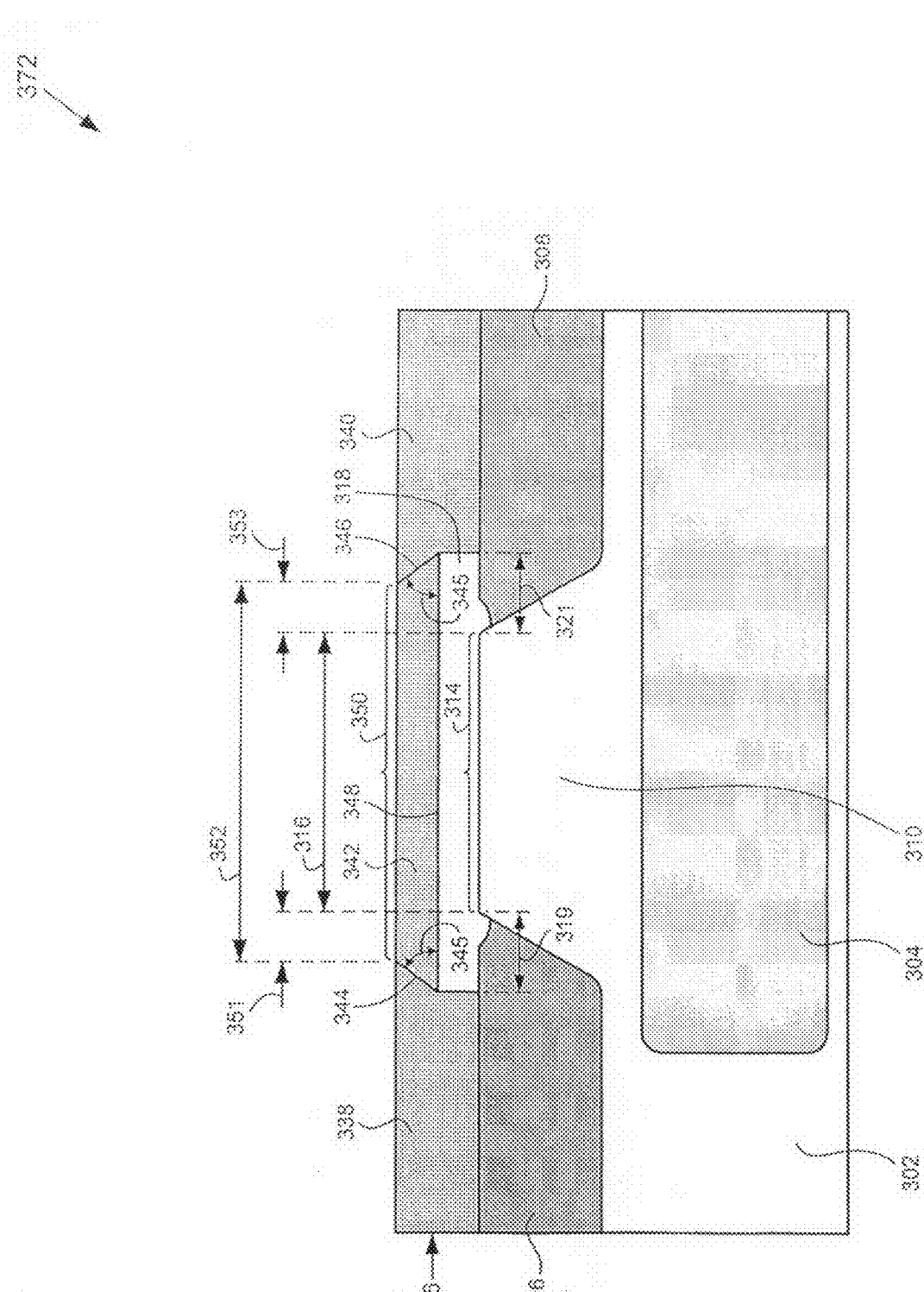
FIG. 3B illustrates a cross-sectional view, which includes a portion of a wafer processed according to an embodiment of the invention, corresponding to an intermediate step in the flowchart in FIG. 1.
Figure 3C:
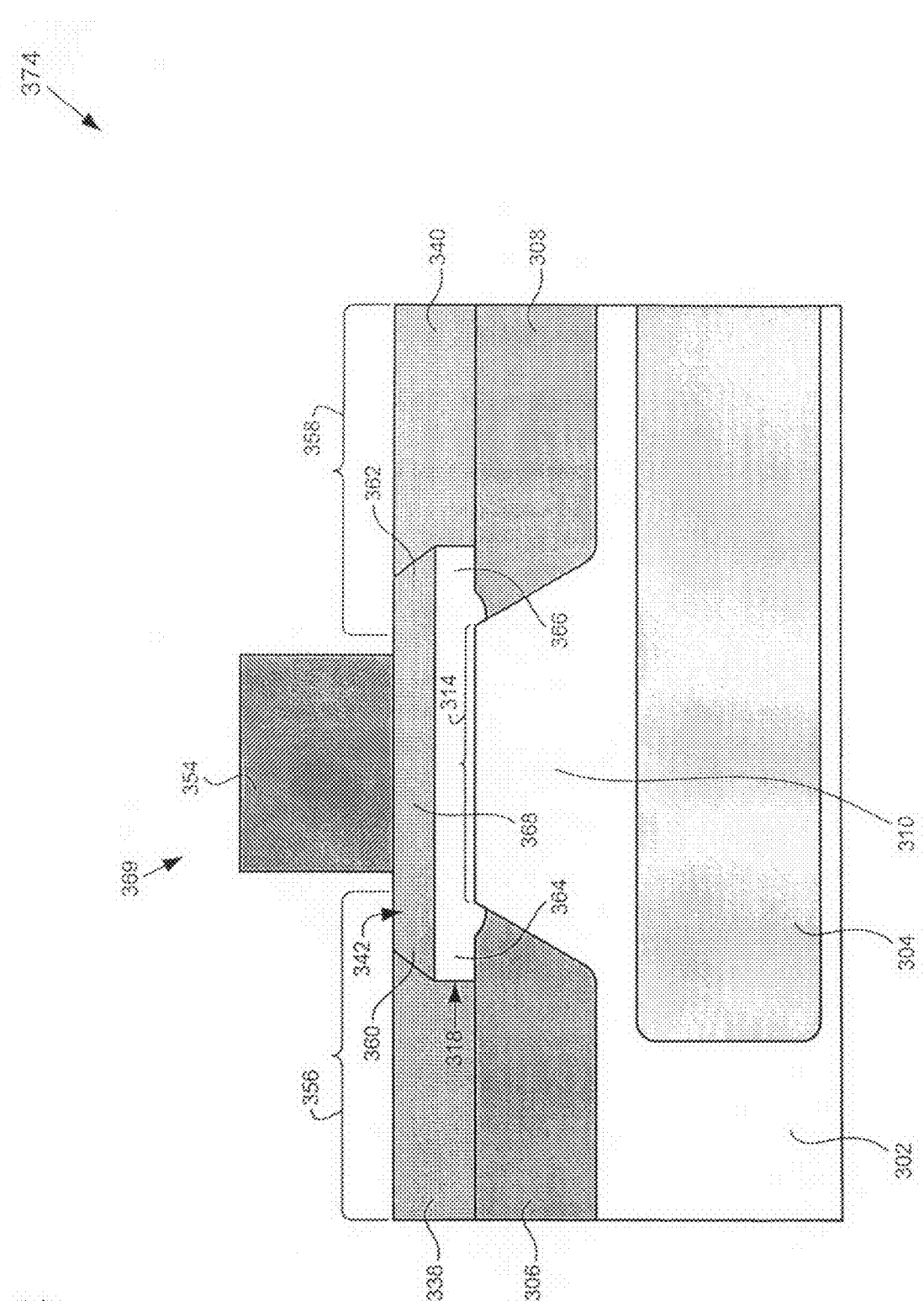
FIG. 3C illustrates a cross-sectional view, which includes a portion of a wafer processed according to an embodiment of the invention, corresponding to a final step in the flowchart in FIG. 1.

Moreover, structures 370 through 374 in FIGS. 3A through 3C illustrate the result of performing steps 270 through 274 of flowchart 200, respectively. For example, structure 370 shows a semiconductor structure after processing step 270, structure 372 shows structure 370 after the processing of step 272, and structure 374 shows structure 372 after the processing of step 274. It is noted that although formation of an NPN SiGe HBT is specifically discussed herein to illustrate the present invention, the present invention can be applied to the formation of other types of bipolar transistors, such as an NPN silicon-germanium-carbon ("SiGeC") HBT, in a BiCMOS process.

Referring now to FIG. 3A, structure 370 of FIG. 3A shows an exemplary structure including a silicon substrate, after completion of step 270 of flowchart 200 in FIG. 2. In structure 370, buried layer 304 is situated in substrate 302, which is a silicon substrate. Buried layer 304 can comprise an N+ type region (i.e. relatively heavily doped N type region). Also in structure 370, isolation regions 306 and 308 are situated in substrate 302 and can comprise STI regions. In other embodiments, isolation regions 306 and 308 may comprise other appropriate isolation material. Isolation regions 306 and 308 can be formed by etching respective trenches in substrate 302 and depositing silicon oxide in the trenches. Further in structure 370, collector region 310 is situated between isolation regions 306 and 308 in substrate 302 and can comprise an N type region, which can be formed by using an appropriate N type dopant implant process. Also in structure 370, active area 314 is situated between isolation regions 306 and 308 in substrate 302 and has width 316.

Referring now to step 270 in FIG. 2 and structure 370 in FIG. 3A, at step 270 of flowchart 200, a oxide layer (not shown in FIG. 3A) situated over isolation regions 306 and 308 and active area 314 is removed and epitaxial extension layer 318 is formed on active area 314 and isolation regions 306 and 308. The oxide layer (not shown in FIG. 3A) can comprise thermal oxide and can be removed by using a wet etch process, which can comprise a hydrofluoric acid ("HF") chemistry or other appropriate chemistry. During the wet etch process, recesses 320 and 322 are formed in corners of respective isolation regions 306 and 308 adjacent to active area 314 as a result of an etch rate difference between thermal oxide in the oxide layer (not shown in FIG. 3A) and deposited oxide in isolation regions 306 and 308. Recesses 320 and 322 expose respective silicon surfaces 324 and 326.

According to the invention, epitaxial extension layer 318 is formed on active area 314 and extends over isolation regions 306 and 308 and can comprise single-crystal silicon. In one embodiment, epitaxial extension layer 318 may comprise a single-crystal semiconductor material other than single-crystal silicon. Epitaxial extension layer 318 can be formed by using a selective epitaxial deposition process to grow silicon surfaces 324 and 326 in the direction indicated by respective arrows 328 and 330 and grow silicon surface 332 in the direction indicated by arrow 334. As a result of the selective epitaxial deposition process, epitaxial extension layer 318 is grown such that it extends over isolation regions 306 and 308 by respective distances 319 and 321. The result of step 270 of flowchart 200 is illustrated by structure 370 in FIG. 3A.

Referring to step 272 in FIG. 2 and structure 272 in FIG. 2B, at step 172 of flowchart 100, base layer 336 is formed on epitaxial extension layer 318 and isolation regions 306 and 306. Base layer 336 comprises polycrystalline base layer segments 338 and 340, which are situated on respective isolation regions 306 and 308, and epitaxial base 342, which is situated on epitaxial extension layer 318. Polycrystalline base layer segments 338 and 340 can comprise polycrystalline SiGe and epitaxial base 342 can comprise epitaxial (i.e. single-crystal) SiGe. In one embodiment, polycrystalline base layer segments 338 and 340 can comprise polycrystalline SiGeC and epitaxial base 342 can comprise epitaxial SiGeC.

Base layer 336 can be formed by using a non-selective epitaxial deposition process to form epitaxial base 342, which can comprise epitaxial single crystal SiGe base on epitaxial extension layer 318, and polycrystalline SiGe segments 338 and 340 on respective isolation regions 306 and 308. During the non-selective epitaxial deposition process, interface 344 forms between polycrystalline base layer segment 338 and epitaxial base 342 and interface 346 forms between epitaxial base 342 and polycrystalline base layer segment 340. Angle 345, at which interfaces 344 and 346 form with respect to top surface 348 of epitaxial extension layer 318, is significantly less than 90.0 degree as a result of facet formation during the non-selective deposition process.

As shown in FIG. 3B, epitaxial base 342 comprises usable emitter formation area 350, which is the area of epitaxial base 342 that is available for emitter formation. Width 352 of usable emitter formation area 350 is substantially equal to the sum of width 316 of active area 314 and distances 351 and 353. Width 352 of usable emitter formation area 350 is affected by angle 345 of interfaces 344 and 346, and distances 319 and 321, which are the respective distances that epitaxial extension layer 318 extends over isolation regions 306 and 308. Thus, by appropriately controlling distances 319 and 321, width 352 of usable emitter formation area 350 can be at least as large as width 316 of active area 314. In one embodiment, width 352 of usable emitter formation area 350 can be larger than width 316 of active area 314.

Thus, by forming epitaxial extension layer 318, which is formed in a selective epitaxial deposition process prior to forming base layer 336, the present invention achieves an epitaxial base having a usable emitter formation area having a width (i.e. width 352) that is at least as large as a width (i.e. width 316) of an active area (i.e. active area 314). In contrast, conventional base layer 112 in FIG. 1, which is formed on active area 120 in a non-selective epitaxial deposition process, provides a useable emitter formation area (i.e. useable emitter formation area 136) having width 138, which is significantly less than width 122 of active area 120. Thus, by providing a useable emitter formation area having a width that is at least as large as the width of an active area, the present invention advantageously achieves a bipolar transistor having an active area with increased scalability. The result of step 272 of flowchart 200 is illustrated by structure 372 in FIG. 3B.

Referring to step 274 in FIG. 2 and structure 374 in FIG. 3C, at step 274 of flowchart 200, emitter 354 is formed on epitaxial base 342 and extrinsic base regions 356 and 358 are formed adjacent to emitter 354. Emitter 354 is situated over intrinsic base region 368 of epitaxial base 342 and can comprise N type polycrystalline silicon, which can be doped with phosphorus or other appropriate N type dopant. Intrinsic base region 368, which is situated in epitaxial base 342 between extrinsic base regions 356 and 358, can comprise a P type region. Extrinsic base regions 356 and 358 are situated adjacent to emitter 354 and can comprise P+ type regions (i.e. relatively heavily doped P type regions).

As a result of forming base layer 336 (FIG. 3B) on epitaxial extension layer 318, isolation regions 306 and 308 more effectively separate respective extrinsic base regions 356 and 358 and collector region 310, which advantageously reduces extrinsic base-collector capacitance of bipolar transistor 369. Since extrinsic base-collector capacitance is a component of total base-collector capacitance, by reducing extrinsic base-collector capacitance the present invention advantageously achieves a reduction in total base-collector capacitance. Furthermore, by forming base layer 336 (FIG. 3B) on epitaxial extension layer 318, the thickness of extrinsic base regions 356 and 358 is increased, which reduces total base resistance of bipolar transistor 369. By way of background, power gain of a bipolar transistor is inversely related to the total base-collector capacitance and the total base resistance. Thus, by reducing the extrinsic base-collector capacitance and the total base resistance, the present invention advantageously causes a significant increase in power gain of bipolar transistor 369. The result of step 274 of flowchart 200 is illustrated by structure 374 in FIG. 3C.

Thus, as discussed above, by forming a base layer, which is formed in a non-selective epitaxial deposition process, on an epitaxial extension layer, which is formed over the active area in a selective epitaxial deposition process, the present invention advantageously achieves an increased usable emitter formation area, which advantageously increases bipolar transistor scalability. Additionally, the present invention achieves a bipolar transistor having reduced extrinsic base-collector capacitance and extrinsic base resistance, which advantageously increase the power gain of the bipolar transistor.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, selective and non-selective epitaxy for base integration in a BiCMOS process and related structure have been described.

The invention claimed is:

1. A bipolar transistor comprising:
   an active area situated between first and second isolation regions in a substrate;
   an epitaxial extension layer situated on said active area, said epitaxial extension layer extending over said first and second isolation regions;
   an epitaxial base situated over said epitaxial extension layer;
   said epitaxial extension layer forming a single-crystal semiconductor material on said active area and over said first and second isolation regions.

2. The bipolar transistor of claim 1 wherein an emitter formation area on said epitaxial base has a width at least as large as a width of said active area.

3. The bipolar transistor of claim 1 wherein said epitaxial base further comprises first and second polycrystalline base layer segments situated on, respectively, said first and second isolation regions.

4. The bipolar transistor of claim 1 wherein said epitaxial extension layer comprises silicon.

5. The bipolar transistor of claim 1 wherein said epitaxial base comprises a single-crystal semiconductor.

6. The bipolar transistor of claim 1 wherein said epitaxial base comprises a single-crystal silicon-germanium.

7. The bipolar transistor of claim 1 further comprising a collector region situated under said epitaxial base.

8. The bipolar transistor of claim 7 wherein said epitaxial extension layer causes a reduction in a base-collector capacitance of said bipolar transistor.

9. The bipolar transistor of claim 2 wherein said epitaxial extension layer causes said width of said emitter formation area to be at least as large as said width of said active area.

10. The bipolar transistor of claim 1 wherein said bipolar transistor is fabricated in a BiCMOS process.

11. A method of fabricating a bipolar transistor, said method comprising steps of
    forming an active area between first and second isolation regions in a substrate;
    forming an epitaxial extension layer comprising a single-crystal semiconductor on said active area, said epitaxial extension layer extending over said first and second isolation regions;
    forming an epitaxial base on said epitaxial extension layer.

12. The method of claim 11 wherein an emitter formation area on said epitaxial base has a width at least as lame as a width of said active area.

13. The method of claim 11 wherein said epitaxial base further comprises first and second polycrystalline base layer segments situated on, respectively, said first and second isolation regions.

14. The method of claim 11 wherein said epitaxial extension layer comprises silicon.

15. The method of claim 11 wherein said epitaxial base comprises a single-crystal semiconductor.

16. The method of claim 11 wherein said epitaxial base comprises a single-crystal silicon-germanium.

17. The method of claim 11 further comprising forming a collector region.

18. The method of claim 17 wherein said epitaxial extension layer causes a reduction in a base-collector capacitance of said bipolar transistor.

19. The method of claim 12 wherein said epitaxial extension layer causes said width of said emitter formation area to be at least as large as said width of said active area.

20. The method of claim 11 wherein said bipolar transistor is fabricated in a BiCMOS process.

* * * * *